United States Patent
Li et al.

(10) Patent No.: US 9,219,601 B2
(45) Date of Patent: Dec. 22, 2015

(54) SYNCHRONISATION METHOD AND DEVICE FOR TRANSMIT AND RECEIVE SYMBOLS OF ALL-DIGITAL RECEIVER

(75) Inventors: Chunying Li, Shenzhen (CN); Kun Xiong, Shenzhen (CN)

(73) Assignee: HYTERA COMMUNICATIONS CORP., LTD., Shenzhen, Guangdong (CN)

( * ) Notice: Subject to any disclaimer, the term of this patent is extended or adjusted under 35 U.S.C. 154(b) by 0 days.

(21) Appl. No.: 14/416,491

(22) PCT Filed: Jul. 25, 2012

(86) PCT No.: PCT/CN2012/079118
§ 371 (c)(1),
(2), (4) Date: Jan. 22, 2015

(87) PCT Pub. No.: WO2014/015480
PCT Pub. Date: Jan. 30, 2014

(65) Prior Publication Data
US 2015/0180650 A1    Jun. 25, 2015

(51) Int. Cl.
| | | |
|---|---|---|
| *H04L 7/00* | (2006.01) | |
| *H04L 7/033* | (2006.01) | |
| *H04B 1/00* | (2006.01) | |
| *H04B 1/16* | (2006.01) | |
| *H04B 17/20* | (2015.01) | |
| *H03L 7/091* | (2006.01) | |

(52) U.S. Cl.
CPC .............. *H04L 7/0337* (2013.01); *H03L 7/091* (2013.01); *H04B 1/0014* (2013.01); *H04B 1/16* (2013.01); *H04B 17/20* (2015.01); *H04L 7/0079* (2013.01); *H04L 7/0334* (2013.01)

(58) Field of Classification Search
CPC ... H04L 7/033; H04L 7/0337; H04L 27/2273; H04L 17/20; H04L 7/0079; H03L 7/091

USPC ........................................... 375/355, 356, 354
See application file for complete search history.

(56) References Cited

U.S. PATENT DOCUMENTS 5,724,396 A * 3/1998 Claydon et al. ................ 375/355
8,582,710 B2 * 11/2013 Pischl et al. ................... 375/362
(Continued)

FOREIGN PATENT DOCUMENTS

| CN | 101820340 A | 9/2010 |
|---|---|---|
| CN | 102170414 A | 8/2011 |

OTHER PUBLICATIONS

Chen et al , Clock Recovery Device and Method, CN 101820340 (English machine language translation, IDS), Sep. 1, 2010.*
(Continued)

*Primary Examiner* — Qutbuddin Ghulamali
(74) *Attorney, Agent, or Firm* — Harness, Dickey & Pierce, P.L.C.

(57) ABSTRACT

A synchronization method and device for transmit and receive symbols of an all-digital receiver. The method comprises the steps of: after receiving a sampling signal sent by a baseband processing chip, the clock signal of which is provided by a second clock source, a digital signal processor (DSP), the clock signal of which is provided by a first clock source, measuring a phase shift between a local sampling symbol and an air interface symbol, and acquiring the phase shift amount; according to the phase shift amount, adjusting a sampling opportunity for the sampling of a digital-analogue/analogue-digital converter; and when the sampling opportunity for the sampling of the digital-analogue/analogue-digital converter has been adjusted, adjusting an interface clock for data transmitting and receiving of the DSP so as to enable the data transmitting and receiving of the DSP to be synchronized with the sampling.

10 Claims, 2 Drawing Sheets

(56) References Cited

U.S. PATENT DOCUMENTS 8,665,929 B1 * 3/2014 Lida et al. .................... 375/219
2005/0047496 A1 3/2005 McIntire et al.

OTHER PUBLICATIONS

International Search Report (English and Chinese) and Written Opinion of the ISA (Chinese) for PCT/CN2012/079118, SA/CN, mailed May 2, 2013.

* cited by examiner

SYNCHRONISATION METHOD AND DEVICE FOR TRANSMIT AND RECEIVE SYMBOLS OF ALL-DIGITAL RECEIVER

TECHNICAL FIELD

The present disclosure relates to the field of communications, and in particular to a method for transmitting and receiving symbols synchronously in an all-digital receiver and a device thereof.

BACKGROUND

There is a strict requirement for phase error with respect to efficient digital modulated signals applied in a high speed communication system, which requires that the phase error between a transmitter and a receiver is controlled in a small range during the reception and modulation to ensure the sensitivity of demodulation.

Specifically, a TETRA (Trans European Trunked Radio) protocol is a standard protocol used widely in trunked channels, for which the modulation mode DQPSK (Differential Quadrature Reference Phase Shift Keying) is used. In order to ensure the sensitivity of reception in the system, the timing difference in the synchronization of symbols is defined in a range of −0.25 symbol to +0.25 symbol in the TETRA protocol.

The main functions of the receiver include carrier synchronization and clock synchronization. In order to control the timing difference in the synchronization of symbols in the range defined in the TETRA protocol, a local sampling clock used for modulation in the all-digital receiver oscillates at a fixed frequency, the calculation of carrier phase error and bit clock error, the estimation of an optimal decision point and the decision of symbols are all achieved by a sampled digital signal processor, and then adjustment is performed by NCO (Numerical Controlled Oscillator) in the conventional technology. Therefore, the difficulty in an early feedback control to analog component by a receiver and in the design of phase locked loop for efficient transmission can be avoided.

The inventors have studied and found that there are at least the following disadvantages for the all-digital receiver in the conventional technology.

In order to ensure the synchronization of all local clocks, generally all clocks of the all-digital receiver in the conventional technology are required to be led out from the same clock source. In most cases, different clock frequencies are required for a baseband processing chip and a DSP (digital signal processing) respectively. An expensive dedicated crystal oscillator is required for leading out the baseband processing chip and the DSP, which respectively require different clock frequencies, from the same clock source, therefore the cost of the all-digital receiver is increased.

SUMMARY

In view of the above, a method and device for transmitting and receiving symbols synchronously in an all-digital receiver are provided according to embodiments of the disclosure, so as to reduce the cost of the all-digital receiver.

The summary according to the embodiments of the disclosure is described as follows.

A method for transmitting and receiving symbols synchronously in an all-digital receiver is provided, which includes:

measuring a phase offset between a local sampling symbol and an air interface symbol to obtain the phase offset, when a sampling signal transmitted by a baseband processing chip with a clock signal provided by a second clock source is received by a digital signal processer (DSP) with a clock signal provided by a first clock source;

adjusting a sampling timing of a digital to analogue/analogue to digital converter based on the phase offset; and adjusting an interface clock for data transmission and reception of the DSP when the sampling timing of the digital to analogue/analogue to digital converter is adjusted, to synchronize the data transmission and reception of the DSP with the sampling.

Preferably, in an embodiment of the disclosure, the process of measuring a phase offset includes: measuring the phase offset between the local sampling symbol and the air interface symbol using a Gardner algorithm, an early-late gate logic algorithm or a timing data-aided algorithm.

Preferably, in an embodiment of the disclosure, the process of adjusting an interface clock for data transmission and reception of the DSP to synchronize the data transmission and reception of the DSP with the sampling includes:

stopping the interface clock for the data transmission and reception of the DSP, and restarting the interface clock for the data transmission and reception when the sampling is started.

Preferably, in an embodiment of the disclosure, the process of adjusting an interface clock for data transmission and reception of the DSP to synchronize the data transmission and reception of the DSP with the sampling includes:

stopping the interface clock for the data transmission and reception of the DSP, and restarting the interface clock for the data transmission and reception when the DSP transmits or receives data.

A device for transmitting and receiving symbols synchronously is further provided according to an embodiment of the disclosure, which includes:

clock sources provided separately for a baseband processing chip and a DSP;

a phase offset obtaining unit, configured to measure a phase offset between a local sampling symbol and an air interface symbol to obtain the phase offset, when a sampling signal transmitted by the baseband processing chip is received by the DSP;

a sampling timing adjusting unit, configured to adjust a sampling timing of a digital to analogue/analogue to digital converter based on the phase offset; and a synchronization unit, configured to adjust an interface clock for data transmission and reception of the DSP when the sampling timing of the digital to analogue/analogue to digital converter is adjusted, to synchronize the data transmission and reception of the DSP with the sampling.

Preferably, in an embodiment of the disclosure, the clock source for the baseband processing chip is provided by a peripheral clock circuit on a baseband board.

Preferably, in an embodiment of the disclosure, the clock source provided for the DSP is a crystal oscillator provided separately.

Preferably, in an embodiment of the disclosure, the crystal oscillator is a 12 MHz crystal oscillator.

Preferably, in an embodiment of the disclosure, the synchronization unit includes:

a clock adjusting module, configured to stop the interface clock for the data transmission and reception of the DSP, and restart the interface clock for the data transmission and reception when the sampling is started.

Preferably, in an embodiment of the disclosure, the synchronization unit includes:

a clock start-stop module, configured to stop the interface clock for the data transmission and reception of the DSP, and restart the interface clock for the data transmission and reception when the DSP transmits or receives data.

As can be seen from the above technical solution, in the embodiments of the disclosure, clock sources are provided for the baseband processing chip and the DSP separately, and the interface clock for data transmission and reception of the DSP is adjusted when the sampling timing of the digital to analogue/analogue to digital converter is adjusted, to synchronize the data transmission and reception of the DSP with the sampling. Therefore, a common crystal oscillator or clock oscillating circuit can be used for the all-digital receiver, it is not necessary to provide the expensive dedicated crystal oscillator, thereby reducing the cost of the all-digital receiver.

DETAILED DESCRIPTION

Hereinafter, the technical solutions in the embodiments of the present disclosure are described clearly and completely in conjunction with the drawings in the embodiments of the present disclosure. Apparently, the described embodiments are only a part of the embodiments of the present disclosure. All the other embodiments obtained by those skilled in the art based on the embodiments of the present disclosure without creative effort will fall within the scope of protection of the disclosure.

Figure 1:
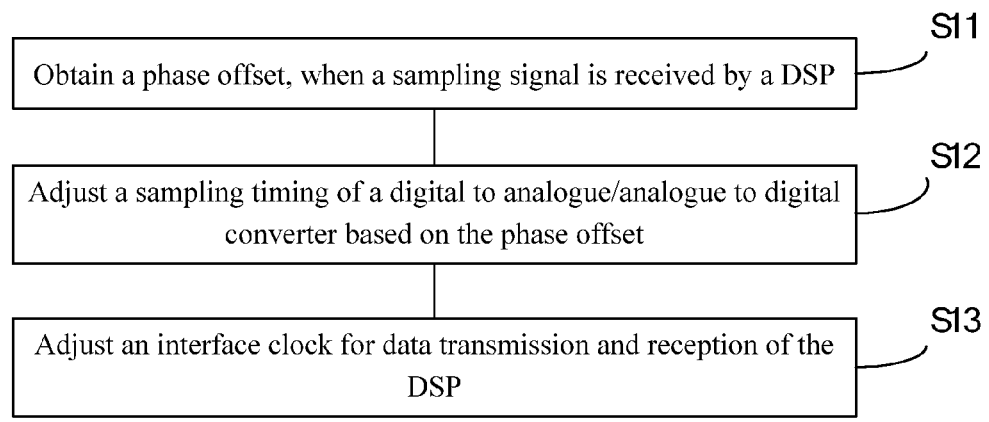
FIG. 1 is a schematic flowchart of a method for transmitting and receiving symbols synchronously according to an embodiment of the disclosure.

In order to reduce the cost of the all-digital receiver by simplifying the circuit design of the all-digital receiver, a method for transmitting and receiving symbols synchronously in an all-digital receiver is provided according to the embodiment of the disclosure, as shown in FIG. 1, which includes steps S11 to S13.

In step S11, a phase offset between a local sampling symbol and an air interface symbol is measured to obtain the phase offset, when a sampling signal transmitted by a baseband processing chip with a clock signal provided by a second clock source is received by a digital signal processer DSP with a clock signal provided by a first clock source.

In the conventional technology, in order to lead out the baseband processing chip and the DSP which respectively require different clock frequencies from the same clock source, an expensive dedicated crystal oscillator with a high precision is required. For cost savings, a dedicated clock source is provided for the baseband processing chip and the DSP respectively in the embodiment of the disclosure. A first clock source is used for the DSP, and a second clock source is used for the baseband processing chip. Only a common crystal oscillator with an appropriate crystal oscillator frequency is required separately for the clock source of the DSP and the clock source of the baseband processing chip. Therefore, the overall cost of the all-digital receiver is reduced effectively.

In the case that two clock sources with different frequencies are used, if one of the clock sources is adjusted, the data of the DSP becomes asynchronous with the data of a receiving sampling chip or a digital to analogue conversion chip, and thus the synchronization of symbols fails. For this end, the phase offset between the local sampling symbol and the air interface symbol is adjusted in the embodiment of the disclosure. In the embodiment of the disclosure, firstly the phase offset is obtained firstly.

Specifically, for the all-digital receiver conforming to the TETRA protocol, generally a symbol clock of 18 KHz is required for the baseband processing chip. For cost savings, the symbol clock of 18 KHz may be obtained by performing frequency division on a clock frequency of 9.216 MHz of a peripheral clock circuit on a baseband board in the embodiment of the disclosure. In other words, the clock source of the baseband processing chip is formed from the peripheral clock circuit on the baseband board, the peripheral clock circuit has a clock frequency of 9.216 MHz, and a symbol clock of approximate 18 KHz may be obtained by performing frequency division on the clock frequency of 9.216 MHz.

For the DSP, the operating frequency is 12 MHz generally. The peripheral clock circuit of the baseband processing chip can not be shared as a clock source of the DSP, and thus a crystal oscillator is provided separately as the clock source for the DSP. In this case, a symbol clock is provided for the DSP with the frequency of 12 MHz. Therefore, cost saving can be implemented by providing a common 12 MHz crystal oscillator.

The operating process of the all-digital receiver is described as follows.

A baseband analogue signal is converted to a digital sampling signal by an A/D converter in the baseband processing chip. Since the rate of the air interface symbol is 18K/S in the TETRA protocol, the clock frequency reference required for the A/D converter is 18 KHz. In the embodiment of the disclosure, the clock source of the clock frequency is provided by the peripheral clock circuit of the baseband processing chip. The symbol clock of approximate 18 KHz may be obtained by performing frequency division on the clock frequency of 9.216 MHz for the peripheral clock circuit.

A baseband DQPSK sampling signal is obtained by processing the digital sampling signal using a gain adjustment module and a baseband shaping filter module in the baseband processing chip. The DQPSK sampling signal may be obtained by the DSP via a data peripheral interface for the DSP, and then the subsequent operations such as demodulation, decision and channel decoding may be performed by the DSP.

Since there is the phase offset between the local sampling symbol and the air interface symbol, the phase offset between the local sampling symbol and the air interface symbol is measured and obtained for the purpose of the synchronization of symbols. A number of ways may be used in measuring the phase offset between the local sampling symbol and the air interface symbol. In the embodiment of the disclosure, the phase offset between the local sampling symbol and the air interface symbol is measured by using a Gardner algorithm, an early-late gate logic algorithm or a timing data-aided algorithm.

In step S12, a sampling timing of a digital to analogue/ analogue to digital converter is adjusted based on the phase offset.

After the phase offset is obtained, the phase offset is fed back to the baseband processing chip, the sampling timing of an A/D converter and a D/A converter is adjusted finely by adjusting a sampling frequency module in the baseband processing chip, and thus the synchronization of symbols is achieved.

In step S13, an interface clock for data transmission and reception of the DSP is adjusted when the sampling timing of the digital to analogue/analogue to digital converter is adjusted, to synchronize the data transmission and reception of the DSP with the sampling.

In the case that the sampling frequency of the baseband processing chip is adjusted, and the reference clock source of the DSP is not the same as that of the baseband processing chip, the baseband processing chip and the DSP, which communicate by transmitting and receiving data via the data peripheral interface, become asynchronous, and thus the synchronization of symbols fails.

For this end, a peripheral interface clock for data transmission and reception of the DSP is adjusted synchronously when the sampling timing of the digital to analogue/analogue to digital converter is adjusted, to synchronize the data transmission and reception of the DSP with the sampling, in the embodiment of the disclosure. In practice, the data transmission and reception of the DSP is synchronized with the sampling by stopping the interface clock for data transmission and reception of the DSP for a preset period of time and then restarting the interface clock for data transmission and reception of the DSP.

Figure 2:
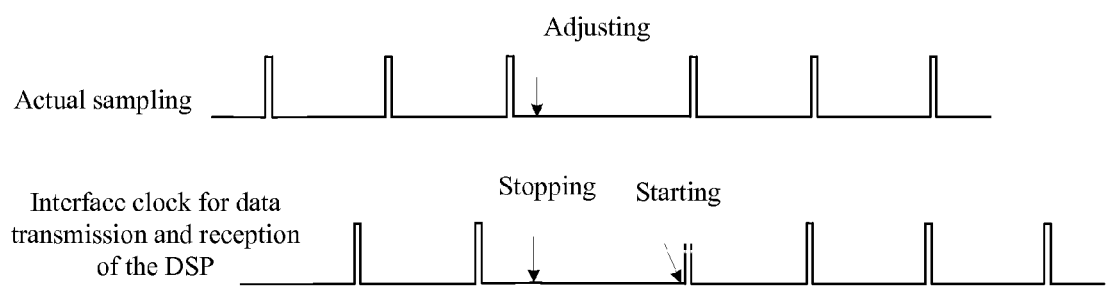
FIG. 2 is a schematic diagram of start-stop timing for adjusting an interface clock for data transmission and reception of a DSP according to an embodiment of the disclosure.

Furthermore, as shown in FIG. 2, in an embodiment of the disclosure, the process of adjusting an interface clock for data transmission and reception of the DSP to synchronize the data transmission and reception of the DSP with the sampling may include:

stopping the interface clock for the data transmission and reception of the DSP, and restarting the interface clock for the data transmission and reception when the sampling is started.

The interface clock for data transmission and reception of the DSP is stopped while the sampling timing of the digital to analogue/analogue to digital converter is adjusted. When the adjustment of the sampling timing of the digital to analogue/analogue to digital converter is completed and the sampling is started, the interface clock for the data transmission and reception is restarted. In this case, the interface clock for data transmission and reception of the DSP is adjusted synchronously in accordance with the adjustment of the sampling timing of the digital to analogue/analogue to digital converter, and therefore the sampling is kept in synchronous with the data transmission and reception, thereby avoiding the failure in the synchronization of symbols.

Figure 3:
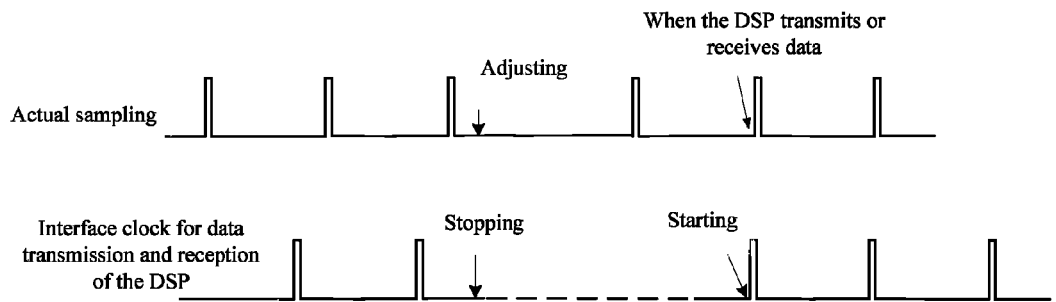
FIG. 3 is a schematic diagram of another start-stop timing for adjusting an interface clock for data transmission and reception of a DSP according to an embodiment of the disclosure.

Alternatively, as shown in FIG. 3, in an embodiment of the disclosure, the process of adjusting an interface clock for data transmission and reception of the DSP to synchronize the data transmission and reception of the DSP with the sampling may include:

stopping the interface clock for the data transmission and reception of the DSP, and restarting the interface clock for the data transmission and reception when the DSP transmits or receives data.

The interface clock for data transmission and reception of the DSP is stopped while the sampling timing of the digital to analogue/analogue to digital converter is adjusted. The failure in the synchronization of symbols can not arise without data transmission and reception, and therefore, the interface clock for data transmission and reception of the DSP may be stopped until the DSP transmits or receives data. That is to say, the interface clock for the data transmission and reception is restarted when the DSP transmits or receives data. The sampling may be kept in synchronous with the data transmission and reception in such way, thereby avoiding the failure in the synchronization of symbols.

From the foregoing, in the embodiments of the disclosure, clock sources are separately provided for the baseband processing chip and the DSP, and the interface clock for data transmission and reception of the DSP is adjusted when the sampling timing of the digital to analogue/analogue to digital converter is adjusted, to synchronize the data transmission and reception of the DSP with the sampling. Therefore, it is avoided that the data of the DSP becomes asynchronous with the data of the baseband processing chip due to a difference between different crystal oscillator sources or clocks when a specified clock in the all-digital receiver is adjusted during operation. In conclusion, a common crystal oscillator or clock oscillating circuit can be used for the all-digital receiver, it is not necessary to provide an expensive dedicated crystal oscillator, thereby reducing the cost of the all-digital receiver in the embodiments of the disclosure.

Figure 4:
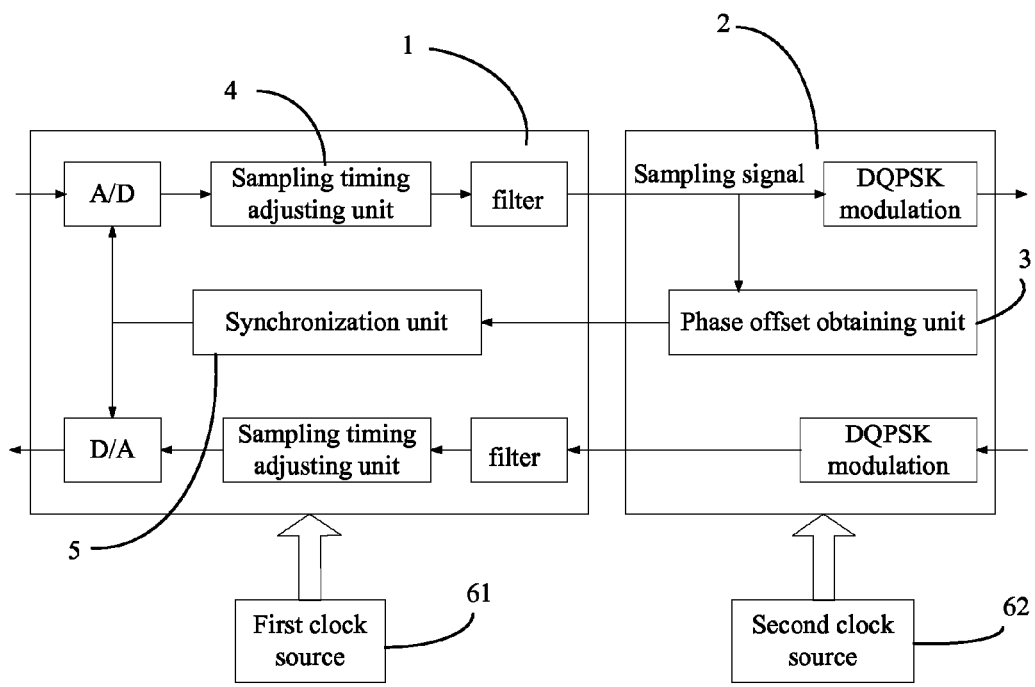
FIG. 4 is a structural schematic diagram of a device for transmitting and receiving symbols synchronously according to an embodiment of the disclosure.

As shown in FIG. 4, a device for transmitting and receiving symbols synchronously in an all-digital receiver is further provided, which includes clock sources provided separately for a baseband processing chip 1 and a DSP 2, a phase offset obtaining unit 3, a sampling timing adjusting unit 4 and a synchronization unit 5. The clock sources include a first clock source 61 and a second clock source 62.

For the all-digital receiver conforming to the TETRA protocol, generally a symbol clock of 18 KHz is required for the baseband processing chip 1. For cost savings, the symbol clock of 18 KHz may be obtained by performing frequency division on a clock frequency of 9.216 MHz for a peripheral clock circuit on a baseband board in the embodiment of the disclosure. In other words, the clock source of the baseband processing chip 1 is generated by the peripheral clock circuit on the baseband board, the peripheral clock circuit has a clock frequency of 9.216 MHz, and a symbol clock of approximate 18 KHz may be obtained by performing frequency division on the clock frequency of 9.216 MHz.

For the DSP 2, the operating frequency is 12 MHz generally. The peripheral clock circuit of the baseband processing chip 1 can not be shared as a clock source of the DSP 2, and thus a crystal oscillator is provided separately as the clock source for the DSP 2. In this case, a symbol clock is provided for the DSP with the frequency of 12 MHz. Therefore, cost saving can be implemented by providing a cheap common 12 MHz crystal oscillator.

In the embodiment of the disclosure, clock sources are provided separately for the baseband processing chip 1 and the DSP 2, and an expensive dedicated crystal oscillator is not required to be used as the clock source for both the baseband processing chip 1 and the DSP 2 like in the conventional technology. Therefore, the cost for the all-digital receiver is reduced effectively.

The phase offset obtaining unit 3 is configured to measure a phase offset between a local sampling symbol and an air interface symbol to obtain the phase offset, when a sampling signal transmitted by the baseband processing chip 1 is received by the DSP 2.

The operating process of the all-digital receiver is described as follows.

A baseband analogue signal is converted to a digital sampling signal by an A/D converter in the baseband processing chip 1. Since the rate of the air interface symbol is 18K/S in the TETRA protocol, the clock frequency reference required for the A/D converter is 18 KHz. In the embodiment of the disclosure, the clock source of the clock frequency is provided by the peripheral clock circuit of the baseband processing chip. The symbol clock of approximate 18 KHz may be obtained by performing frequency division on the clock frequency of 9.216 MHz for the peripheral clock circuit.

A baseband DQPSK sampling signal is obtained by processing the digital sampling signal using a gain adjustment module and a baseband shaping filter module in the baseband processing chip 1. The DQPSK sampling signal may be obtained by the DSP via a data peripheral interface for the DSP, and then the subsequent operations such as demodulation, decision and channel decoding may be performed by the DSP 2.

Since there is the phase offset between the local sampling symbol and the air interface symbol, the phase offset between the local sampling symbol and the air interface symbol is measured and obtained for the purpose of the synchronization of symbols. A number of ways may be used in measuring the phase offset between the local sampling symbol and the air interface symbol. In the embodiment of the disclosure, the phase offset between the local sampling symbol and the air interface symbol is measured by using a Gardner algorithm, an early-late gate logic algorithm or a timing data-aided algorithm.

The sampling timing adjusting unit 4 is configured to adjust a sampling timing of a digital to analogue/analogue to digital converter based on the phase offset.

After the phase offset is obtained, the phase offset is fed back to the baseband processing chip 1, the sampling timing of an A/D converter and a D/A converter is adjusted finely by adjusting a sampling frequency module in the baseband processing chip 1, and thus the synchronization of symbols is achieved.

The synchronization unit 5 is configured to adjust an interface clock for data transmission and reception of the DSP 2 when the sampling timing of the digital to analogue/analogue to digital converter is adjusted, to synchronize the data transmission and reception of the DSP 2 with the sampling.

In the case that the sampling frequency of the baseband processing chip 1 is adjusted, and the reference clock source of the DSP 2 is not the same as that of the baseband processing chip 1, the baseband processing chip 1 and the DSP 2, which communicate by transmitting and receiving data via the data peripheral interface, become asynchronous, and thus the synchronization of symbols fails.

For this end, a peripheral interface clock for data transmission and reception of the DSP 2 is adjusted synchronously when the sampling timing of the digital to analogue/analogue to digital converter is adjusted, to synchronize the data transmission and reception of the DSP 2 with the sampling, in the embodiment of the disclosure. In practice, the data transmission and reception of the DSP 2 is synchronized with the sampling by stopping the interface clock for data transmission and reception of the DSP 2 for a preset period of time and then restarting the interface clock for data transmission and reception of the DSP 2.

Furthermore, the synchronization unit 5 may include a clock adjusting module in an embodiment of the disclosure. The clock adjusting module is configured to stop the interface clock for the data transmission and reception of the DSP 2, and restart the interface clock for the data transmission and reception when the sampling is started.

The interface clock for data transmission and reception of the DSP 2 is stopped while the sampling timing of the digital to analogue/analogue to digital converter is adjusted. When the adjustment of the sampling timing of the digital to analogue/analogue to digital converter is completed and the sampling is started, the interface clock for the data transmission and reception is restarted. In this case, the interface clock for data transmission and reception of the DSP 2 is adjusted synchronously in accordance with the adjustment of the sampling timing of the digital to analogue/analogue to digital converter, and therefore, the sampling is kept in synchronous with the data transmission and reception, thereby avoiding the failure in the synchronization of symbols.

The synchronization unit 5 may further include a clock start-stop module in an embodiment of the disclosure. The clock start-stop module is configured to stop the interface clock for the data transmission and reception of the DSP 2, and restart the interface clock for the data transmission and reception when the DSP 2 transmits or receives data.

The interface clock for data transmission and reception of the DSP 2 is stopped while the sampling timing of the digital to analogue/analogue to digital converter is adjusted. The failure in the synchronization of symbols can not arise without data transmission and reception, and therefore, the interface clock for data transmission and reception of the DSP 2 may be stopped until the DSP 2 transmits or receives data. That is to say, the interface clock for the data transmission and reception is restarted when the DSP 2 transmits or receives data. The sampling may be kept in synchronous with the data transmission and reception in such way, thereby avoiding the failure in the synchronization of symbols.

The above description of the embodiments disclosed herein enables those skilled in the art to implement or use the present disclosure. Numerous modifications to the embodiments will be apparent to those skilled in the art, and the general principle herein can be implemented in other embodiments without deviation from the spirit or scope of the embodiments of the present disclosure. Therefore, the present disclosure is not limited to the embodiments described herein, but in accordance with the widest scope consistent with the principle and novel features disclosed herein.

The invention claimed is:

1. A method for transmitting and receiving symbols synchronously in an all-digital receiver, comprising:
   measuring a phase offset between a local sampling symbol and an air interface symbol to obtain the phase offset, when a sampling signal transmitted by a baseband processing chip with a clock signal provided by a second clock source is received by a digital signal processor (DSP) with a clock signal provided by a first clock source;
   adjusting a sampling timing of a digital to analogue and analogue to digital converter based on the phase offset; and
   adjusting an interface clock for data transmission and reception of the DSP when the sampling timing of the digital to analogue and analogue to digital converter is adjusted, to synchronize the data transmission and reception of the DSP with the sampling timing.

2. The method for transmitting and receiving symbols synchronously according to claim 1, wherein the process of measuring a phase offset comprises:
   measuring the phase offset between the local sampling symbol and the air interface symbol using a Gardner algorithm, an early-late gate logic algorithm or a timing data-aided algorithm.

3. The method for transmitting and receiving symbols synchronously according to claim 2, wherein the process of adjusting the interface clock for data transmission and reception of the DSP to synchronize the data transmission and reception of the DSP with the sampling timing comprises:
   stopping the interface clock for the data transmission and reception of the DSP, and restarting the interface clock for the data transmission and reception when the sampling is started.

4. The method for transmitting and receiving symbols synchronously according to claim 2, wherein the process of adjusting the interface clock for data transmission and reception of the DSP to synchronize the data transmission and reception of the DSP with the sampling timing comprises:
   stopping the interface clock for the data transmission and reception of the DSP, and restarting the interface clock for the data transmission and reception when the DSP transmits or receives data.

5. A device for transmitting and receiving symbols synchronously in an all-digital receiver, comprising:
   clock sources provided separately for a baseband processing chip and a DSP;
   a phase offset obtaining unit, configured to measure a phase offset between a local sampling symbol and an air interface symbol to obtain the phase offset, when a sampling signal transmitted by the baseband processing chip is received by the DSP;
   a sampling timing adjusting unit, configured to adjust a sampling timing of a digital to analogue and analogue to digital converter based on the phase offset; and
   a synchronization unit, configured to adjust an interface clock for data transmission and reception of the DSP when the sampling timing of the digital to analogue and analogue to digital converter is adjusted, to synchronize the data transmission and reception of the DSP with the sampling timing.

6. The device for transmitting and receiving symbols synchronously according to claim 5, wherein the clock source for the baseband processing chip is provided by a peripheral clock circuit on a baseband board.

7. The device for transmitting and receiving symbols synchronously according to claim 6, wherein the clock source provided for the DSP is a crystal oscillator provided separately.

8. The device for transmitting and receiving symbols synchronously according to claim 7, wherein the crystal oscillator is a 12 MHz crystal oscillator.

9. The device for transmitting and receiving symbols synchronously according to claim 8, wherein the synchronization unit comprises:
   a clock adjusting module, configured to stop the interface clock for the data transmission and reception of the DSP, and restart the interface clock for the data transmission and reception when the sampling is started.

10. The device for transmitting and receiving symbols synchronously according to claim 8, wherein the synchronization unit comprises:
   a clock start-stop module, configured to stop the interface clock for the data transmission and reception of the DSP, and restart the interface clock for the data transmission and reception when the DSP transmits or receives data.

* * * * *